US007327053B2

(12) United States Patent
Eckardt et al.

(10) Patent No.: US 7,327,053 B2
(45) Date of Patent: Feb. 5, 2008

(54) ELECTRONIC POWER CIRCUIT

(75) Inventors: Dieter Eckardt, Herzogenaurach (DE); Carsten Rebbereh, Kersbach (DE); Hubert Schierling, Erlangen (DE); Benno Weis, Hemhofen (DE)

(73) Assignee: Siemens Aktiengesellschaft, München (DE)

( * ) Notice: Subject to any disclaimer, the term of this patent is extended or adjusted under 35 U.S.C. 154(b) by 313 days.

(21) Appl. No.: 10/464,872

(22) Filed: Jun. 18, 2003

(65) Prior Publication Data

US 2004/0004404 A1 Jan. 8, 2004

Related U.S. Application Data

(63) Continuation of application No. PCT/DE01/04486, filed on Nov. 29, 2001.

(30) Foreign Application Priority Data

Dec. 18, 2000 (DE) ................................ 100 63 084

(51) Int. Cl.
*G05F 1/10* (2006.01)
*G05F 3/02* (2006.01)
*H02H 7/00* (2006.01)
*H01H 83/18* (2006.01)

(52) U.S. Cl. ...................... 307/126; 327/537; 327/535; 307/125

(58) Field of Classification Search ................ 327/536, 327/537, 535; 307/126, 125
See application file for complete search history.

(56) References Cited

U.S. PATENT DOCUMENTS 3,740,581 A 6/1973 Pfiffner
5,550,463 A * 8/1996 Coveley ..................... 323/300
6,011,708 A * 1/2000 Doht et al. .................... 363/98
6,201,357 B1 * 3/2001 Seiler et al. ................ 315/291
6,313,482 B1 * 11/2001 Baliga ......................... 257/77
6,462,603 B1 * 10/2002 Pong et al. ................. 327/365
6,529,034 B1 * 3/2003 Ranjan ........................ 326/19
6,859,021 B2 * 2/2005 Link .......................... 323/284

FOREIGN PATENT DOCUMENTS

DE 195 17 831 A 11/1995
DE 195 35 541 A 3/1997
DE 196 10 135 C1 6/1997
JP 09 307070 A 11/1997
JP 2000 224867 A 8/2000

OTHER PUBLICATIONS

Amos, S.W., Newnes Dictionary of Electronics, Reed Educational and Professional Publishing, 1999, edtion 4, p. 177.*

* cited by examiner

*Primary Examiner*—Michael Sherry
*Assistant Examiner*—Michael Rutland-Wallis
(74) *Attorney, Agent, or Firm*—Henry M. Feiereisen; Ursula B. Day

(57) ABSTRACT

An electronic power circuit includes at least one power semiconductor whose control inputs are connected to a trigger device and a power supply which, on the output side, is connected to terminals of the trigger device and, on the input side, is connected to an accessory device to which a supply voltage is applied. The power semiconductor is implemented as a self-conducting power semiconductor, which economically reduces the forward power losses and switching losses of an electronic power circuit.

29 Claims, 12 Drawing Sheets

ELECTRONIC POWER CIRCUIT

CROSS-REFERENCES TO RELATED APPLICATIONS

This application is a continuation of prior filed copending PCT International Application No. PCT/DE01/04486, filed Nov. 29, 2001, on which priority is claimed under 35 U.S.C. § 120, the disclosure of which is hereby incorporated by reference.

This application claims the priority of German Patent Application, Serial No. 100 63 084.7, filed Dec. 18, 2000, pursuant to 35 U.S.C. 119(a)-(d), the disclosure of which is incorporated herein by reference.

BACKGROUND OF THE INVENTION

The invention relates to an electronic power circuit, and more particularly to an electronic power circuit with low forward and switching losses for a trigger device.

Among electronic power circuits are converter circuits, such as a self-commutated converter which can be operated as an inverter or a rectifier, or a DC/DC converter which can be implemented as a buck converter and/or a boost converter or as part of a switched mode power supply. All these electronic power circuits have in common that they include at least one power semiconductor which is controlled by a corresponding trigger device. To supply a corresponding control current and/or control voltage, the trigger device is connected to outputs of a current supply. The current supply can be connected to a single-phase or multi-phase power network or to a voltage link capacitor of a converter circuit.

Electronic power circuits operate in a voltage range above 100 V. Self-blocking semiconductor are used exclusively as power semiconductors in this voltage range. These self-blocking semiconductors have in common that they are blocking at a control voltage of 0 V. In other words, the self-blocking semiconductor conducts current only when the control voltage exceeds a certain positive value. The self-blocking design of the semiconductors can require a fairly high forward voltage, which during operation can cause forward losses as well as switching losses. Cooling devices may have to be employed to remove the heat dissipation which is partially caused by the self-blocking design of the semiconductors. This increases the required installation space for an electronic power circuit; moreover, electronic power circuits may therefore not be installed in close proximity of other devices that dissipate heat.

The forward losses and switching losses increase with the voltage applied to the power semiconductor. At very high voltages, for example voltages close to 5 kV, only self-blocking bipolar semiconductor switches made of silicon are used for commercially available electronic power circuits.

German Pat. No. DE 196 10 135 C1 discloses a hybrid-power-MOSFET with a self-blocking n-channel MOSFET, in particular a low voltage power MOSFET, and a self-conducting n-channel junction MOSFET. This junction-FET with a high blocking voltage is also referred to as Junction Field Effect Transistor (JFET). These two FETs are connected in series in such a way, that the source terminal of the junction-FET is electrically connected to the drain terminal of the MOSFET and the gate terminal of the junction FET is electrically connected to the source terminal of the MOSFET. This electrical connection of two semiconductor components is typically referred to as cascaded or series connection. The MOSFET with a low blocking voltage of this series connection has an internal bipolar diode which is connected antiparallel to the MOSFET and is generally referred to as reverse or internal free-wheeling diode. The self-blocking n-channel MOSFET of this hybrid power MOSFET is made of silicon, whereas the self-conducting n-channel JFET is made of silicon carbide. This hybrid power MOSFET is designed for a high blocking voltage in excess of 600 V and exhibits only small forward losses.

This hybrid power MOSFET which is self-blocking can hence replace the bipolar semiconductor switches made of silicon used in the aforedescribed electronic power circuits, without requiring changes in the electronic power circuits. This hybrid power MOSFET is made of two semiconductor chips and therefore takes up a relatively large surface area. This not only increases the space requirement of the electronic power circuit, but also its cost.

It would therefore be desirable and advantageous to provide an improved electronic power circuit for a trigger device, which obviates prior art shortcomings and is able to specifically further reduce forward losses and switching losses, without increasing the cost.

SUMMARY OF THE INVENTION

According to one aspect of the invention, an electronic power circuit includes at least one power semiconductor implemented as a self-conducting power semiconductor, a trigger device having an output connected to control inputs of the at least one power semiconductor; a power supply having an output side, which is operatively connected to the trigger device, and an input side; and an accessory device power operatively connected to the input side of the power supply and receiving a supply voltage.

The self-conducting power semiconductor further reduces the forward losses and switching losses of the electronic power circuit. Since the number of semiconductor chips is reduced by 50% as compared to hybrid power MOSFET's, this electronic power circuit also requires less installation space and is more cost-effective than an electronic power circuit with hybrid power MOSFET's. To operate the electronic power circuit with self-conducting power semiconductors, the accessory device connected before the power supply should be configured so that the power supply can be supplied with a predetermined supply voltage for the trigger device of the self-conducting power semiconductor immediately after a power switch is closed. In this case, the electronic power circuit can be switched on by blocking the self-conducting power semiconductor of the electronic power circuit. This results in an electronic power circuit which operates like an electronic power circuit with self-blocking power semiconductors, accompanied by significantly reduced forward losses and switching losses.

According to an advantageous feature of the invention, the self-conducting power semiconductor is a junction-FET (JFET) with a high blocking voltage which can be made of silicon carbide. This power semiconductor switch can be operated at a high-temperature, and significantly less heat is dissipated than with conventional electronic power circuits. As a result, the electronic power circuit requires less installation space. In addition, the electronic power circuit according to the invention can be placed in direct proximity of devices or even inside devices that dissipate heat. Accordingly, an electronic power circuit according to the invention can be integrated in a terminal box of an electric motor without requiring a dedicated heat removal device.

According to another advantageous feature of the invention, the self-conducting power semiconductor is constructed so as to have a saturating characteristic which limits a current flow through the self-conducting power semiconductor independent of an applied voltage. The self-conducting power semiconductor can be made of silicon carbide. When using such self-conducting power semiconductor, a separate accessory device for powering the trigger device of the self-conducting power semiconductor can be eliminated. As a result, the forward losses of an electronic power circuit can be reduced simply by replacing the self-blocking power semiconductor with a self-conducting power semiconductor.

According to another advantageous feature, the accessory device can include a rectifier, a switch for connecting an AC-side of the rectifier to a supply voltage of a power grid, and an auxiliary capacitor connected across a DC-side of the rectifier and connected to the input side of the power supply.

According to yet another advantageous feature of the invention, the electronic power circuit can include a free-wheeling converter having an input side connected to an electric power grid, and a voltage link capacitor. The accessory device can include an auxiliary capacitor electrically connected across a DC-output side of the converter, and a switch arranged in a connection between the voltage link capacitor and the auxiliary capacitor. The input side of the power supply is here connected with the DC-output side of the converter.

According to still another advantageous feature of the invention, the electronic power circuit can include a free-wheeling converter with an input side connected to an electric power grid, a voltage link capacitor, and a precharging resistor arranged in a positive line between an output of the converter and the voltage link capacitor. A switch bridges the precharging resistor. The accessory device can include an auxiliary capacitor and a decoupling diode electrically connected in series, with the series connection connected in parallel to the output of the converter, wherein the input side of the power supply is electrically connected in parallel to the auxiliary capacitor and linked via a control line to the switch that bridges the precharging resistor.

According to another advantageous feature of the invention, the electronic power can include a free-wheeling converter having an input side connected to an electric power grid, a voltage link capacitor, and an NTC resistor connected in a ground connection between an output side of the converter and the voltage link capacitor. The accessory device can include a decoupling diode and an auxiliary capacitor connected in series, with the series connection connected in parallel to the output side of the converter and the auxiliary capacitor connected in parallel to the input side of the power supply. The accessory device can further include two anti-parallel connected Zener diodes, and at least one resistor. The resistor is connected with a control terminal of the self-conducting power semiconductor and via the Zener diodes to a ground terminal of the converter. In addition, another decoupling diode can be connected between the resistor and the control terminal of the self-conducting power semiconductor.

Alternatively, instead of connecting the resistor with a control terminal of the self-conducting power semiconductor, the resistor can be connected via a decoupling diode to a positive output of the power supply.

According to another advantageous feature, the electronic power circuit can include a half-controlled converter connected to an electric power grid, a second trigger device connected to an output of the power supply and controlling the half-controlled converter, a voltage link capacitor, and at least one diode. The accessory device can include an auxiliary capacitor and a decoupling diode which are electrically connected in series, with the series connection connected in parallel with an output of the converter. The input side of the power supply can be connected in parallel to the auxiliary capacitor, wherein a connection point of the decoupling diode and the auxiliary capacitor is decoupled from a power supply line by the at least one diode.

The switch can be an electronic switch. The power supply can be a DC/DC converter, a switched mode power supply. The auxiliary capacitor can have a capacitance value which is significantly smaller than a capacitance value of the voltage link capacitor.

The electronic power circuit can be an inverter, a self-commutated network converter, or a matrix converter.

In operation, the self-conducting power semiconductors are blocked when the power supply for the trigger device of the self-conducting power semiconductor(s) reaches a predetermined supply voltage. The electronic power circuit can be turned on by a switch only when the power supply of the trigger device of the self-conducting power semiconductor(s) supplies a predetermined supply voltage capable of blocking the self-conducting power semiconductor(s). Only very few changes or additional components are required for keeping a conventional electronic power circuits functional when the self-blocking power semiconductors are replaced by self-conducting power semiconductors.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
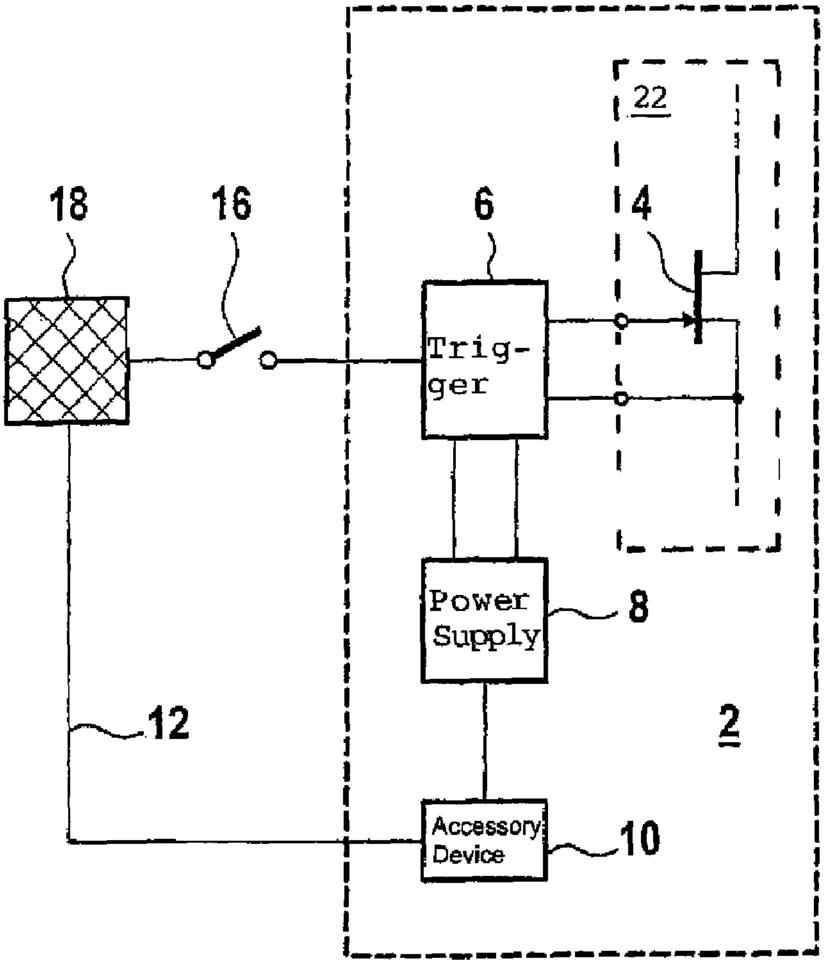
FIG. 1 shows a block diagram of a first embodiment of an electronic power circuit according to the present invention.

Throughout all the Figures, same or corresponding elements are generally indicated by same reference numerals. These depicted embodiments are to be understood as illustrative of the invention and not as limiting in any way.

Turning now to the drawing, and in particular to FIG. 1, there is shown a first embodiment of an electronic power circuit 2 according to the present invention. The electronic power circuit 2 includes at least one self-conducting power semiconductor 4, whose control inputs are connected to a corresponding trigger device 6. The electronic power circuit 2 also includes a power supply 8 for the trigger device 6 and an accessory device 10. The output side of the accessory device 10 is connected to terminals of the power supply 8 of the trigger device 6. In addition, the accessory device 10 is connected to a power grid or network 18 via a line 12. The electronic power circuit 2 can be connected to the network 18 with the help of an ON/OFF switch. The self-conducting power semiconductor 4 is herein depicted as an n-channel junction FET, in particular a FET with a high reverse blocking voltage. As mentioned above, this n-channel junction FET with the high reverse blocking voltage is also referred to as a Junction-Field-Effect-Transistor (JFET). In a particularly advantageous embodiment, this JFET is made of silicon carbide. The accessory device 10 ensures that the power supply produces a predetermined supply voltage for the trigger device 6 of the self-conducting power semiconductor 4, so that after the self-conducting power semiconductor 4 is blocked, the electronic power circuit can operate like a conventional electronic power circuit employing self-blocking power semiconductors.

Using self-conducting power semiconductors 4 significantly reduces the forward losses of an electronic power circuit 2. The accessory device 10 is quite simple and inexpensive, so that the forward losses of electronic power circuit 2 can be reduced without adding cost. Not only the forward losses, but also the costs are reduced compared to an electronic power circuit 2 that employs hybrid power MOSFETs in place of the self-conducting power semiconductors 4.

Figure 3:
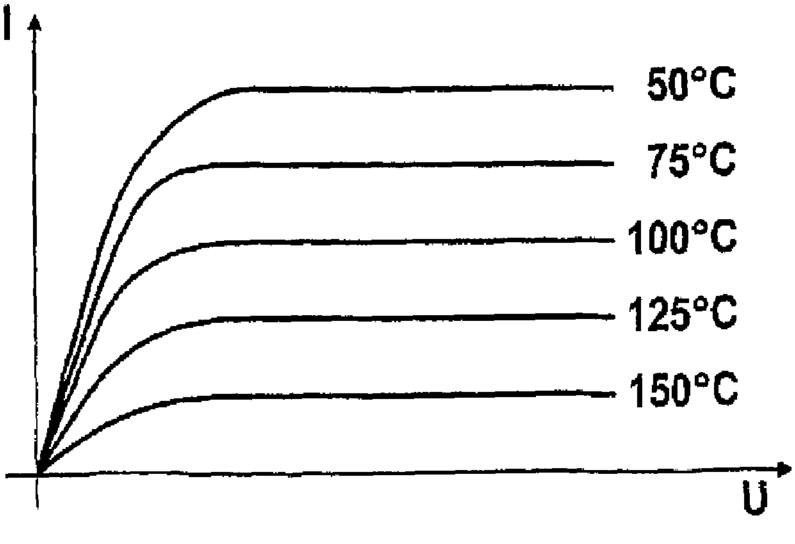
FIG. 3 is a graphical illustration of temperature-dependent saturation curves in an I/U diagram.
Figure 2:
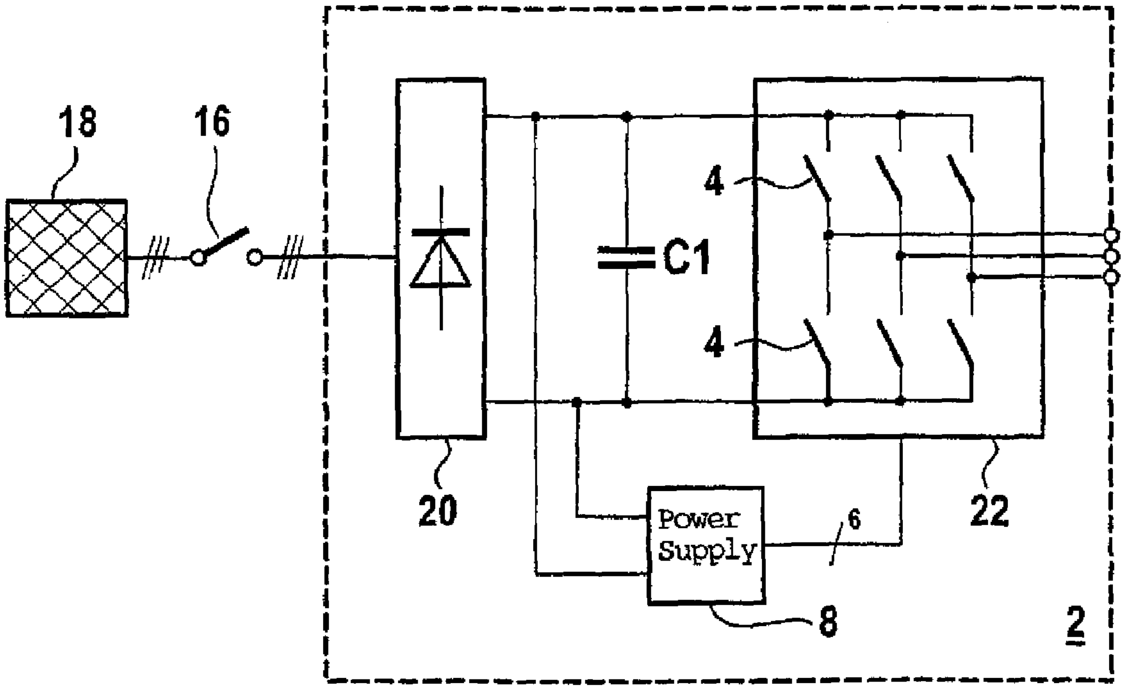
FIG. 2 is a block diagram of a second embodiment of the electronic power circuit according to the present invention.

FIG. 2 shows a block diagram of a preferred embodiment of the electronic power circuit 2 according to the invention, here embodied as a voltage link converter. The voltage link converter has as a converter 20 on the network side a free-running converter, also referred to as rectifier, a voltage link capacitor C1 and an inverter 22 with six self-conducting power semiconductors 4. The input side of the power supply 8 for the trigger device 6 is electrically connected parallel to the voltage link capacitor C1. The trigger device 6 has been omitted in some of the Figures for sake of clarity, but also because trigger devices frequently form an integrated component of inverters 22. The network-side converter 20 can be connected to the supply network 18 on the AC-side by way of an ON/OFF switch 16, for example a contactor. The power supply 8 of the trigger device 6 is a switched mode power supply which generates from a link voltage of several 100V, for example, a supply voltage of +/−25V for the trigger devices. The self-conducting power semiconductors 4 in this embodiment are JFET's made of silicon carbide, which are dimensioned so as to limit the current through the self-conducting power semiconductor 4 independent of the applied voltage. This is achieved with a JFET that has a non-linear voltage-current characteristic curve according to FIG. 3, which limits the current through the self-conducting power semiconductor 4 to a value that is independent of the applied voltage. The non-linear characteristic can be selected so that a portion of the link voltage is applied to the self-conducting power semiconductors 4 only after the current exceeds a predetermined value. The self-conducting power semiconductors 4 are hence undetectable at low currents and thus cause only insignificant losses in continuous operation.

Since each of the self-conducting power semiconductors 4 has a nonlinear current-voltage characteristic, the accessory device 10 for the power supply 8 of the trigger device 6 is no longer necessary. Conversely, in the absence of the nonlinear current-voltage characteristic, the self-conducting power semiconductors 4 short-circuit the voltage link capacitor C1, so that a link voltage can not be generated when the voltage link converter is switched on. In the absence of the link voltage, there is also no supply voltage applied to the trigger devices 6 of the self-conducting power semiconductors 4, so that these cannot be triggered. The link voltage is generated as a result of the nonlinear current-voltage characteristic of each of the self-conducting power semiconductors 4, so that power dissipation has to be tolerated.

Figure 4:
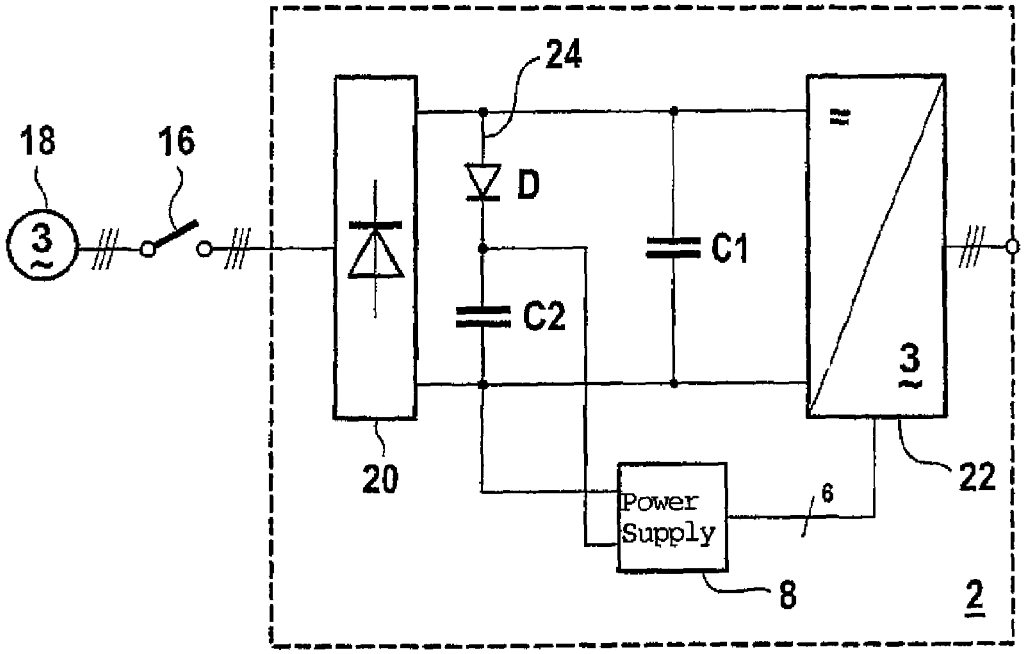
FIG. 4 is a block diagram of a variation of the electronic power circuit of FIG. 2.

FIG. 4 depicts an advantageous embodiment of electronic power circuit 2 according to FIG. 2. The schematic shows only those portions of the electronic power circuit 2 of FIG. 2 that are required for the discussion. Unlike the embodiment of electronic power circuit 2 according to FIG. 2, this embodiment includes a series connection 24 with a decoupling diode D and an auxiliary capacitor C2. The series connection 24 is connected electrically parallel to the voltage link capacitor C1. The power supply 8 for the trigger devices 6 of the self-conducting power semiconductors 4 is on the input side electrically connected parallel to the auxiliary capacitor C2. The decoupling diode D decouples the two capacitors C1 and C2 from each other. As a result, the voltage link capacitor C1 can be discharged when the voltage link converter is briefly switched off, without causing the input voltage of the power supply 8 of the trigger devices 6 to vanish. The voltage link capacitor C1 can be discharged by switching on all power semiconductors 4 of the inverter 22 of the voltage link converter. The voltage link converter becomes operational again immediately after being switched on again, since the input voltage for the power supply 8 need not be built up first. The capacitance value of the auxiliary capacitor C2 depends on the required bridging time.

Figure 5:
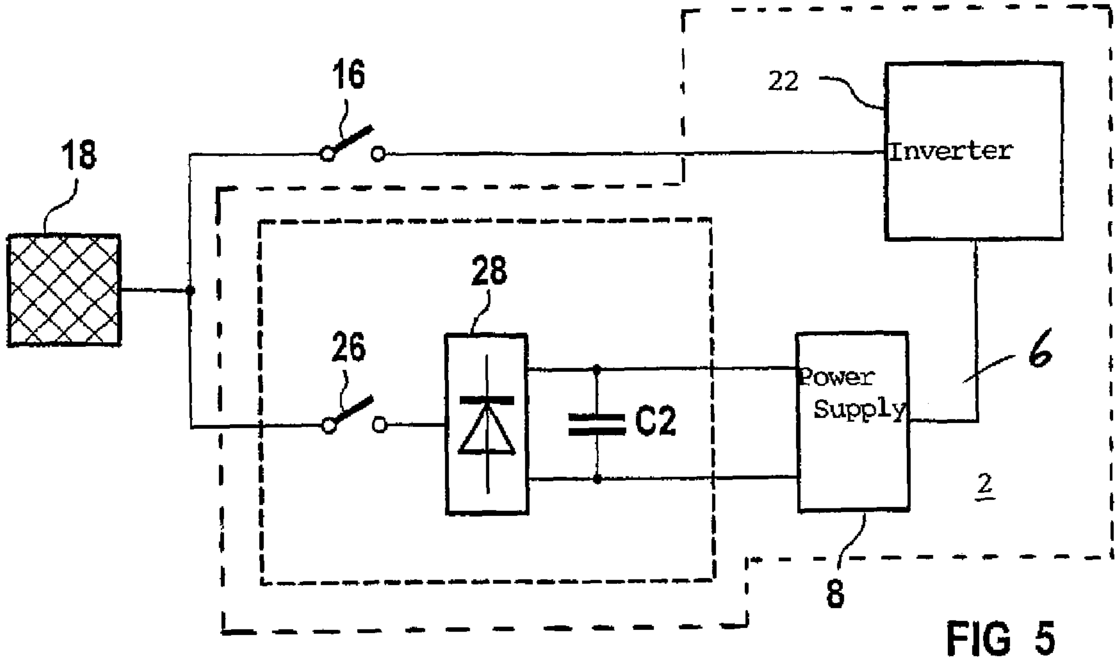
FIGS. 5 to 13 show each a block diagram of further embodiments of an electronic power circuit according to the present invention.

FIG. 5 shows a first embodiment of the accessory device 10 for the power supply 8 of the trigger device 6 of a self-conducting power semiconductor 4. The accessory device 10 includes a switch 26, a rectifier 28 with an auxiliary capacitor C2 located on the DC-side and a sequence controller (not shown). The switch 26 connects the rectifier 28 on the AC-side to the supply network 18, to which the electronic power circuit 2 can be connected by way of an ON/OFF switch 16. The power supply 18 is, on the input side, connected electrically parallel to the auxiliary capacitor 02. When the switch 26 is closed, a DC voltage builds up for the power supply 8 by way of the rectifier 28 and the auxiliary capacitor C2. From this input DC voltage, the power supply 8 produces a supply voltage for the trigger circuit 6 of a self-conducting power semiconductor 4. As soon as the supply voltage of the trigger device 6 is built up, the self-conducting power switch 4 of the electronic power circuit 2 is blocked.

Figure 6:
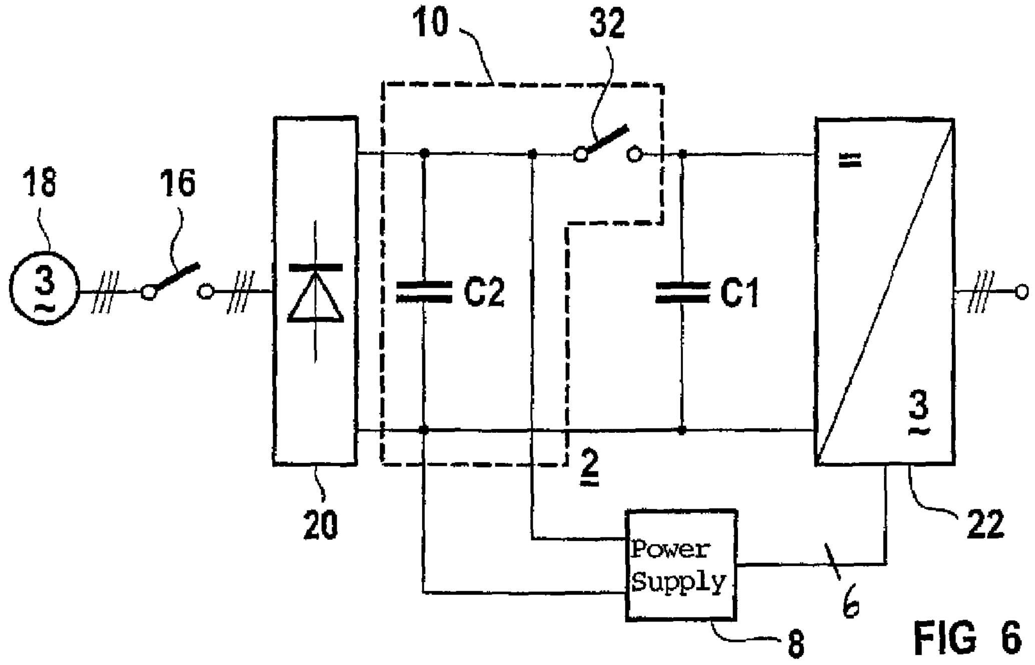

FIG. 6 depicts in more detail an advantageous embodiment of the device of FIG. 1. The accessory device 10 includes a switch 32 and an auxiliary capacitor C2. The auxiliary capacitor C2 is connected electrically parallel to the voltage link capacitor C1, wherein the switch 32 is arranged in a connection between the two capacitors C1 and C2 connected in parallel. It is inconsequential in which connection the switch 32 is placed. The input of the power supply 8 is connected electrically parallel to the auxiliary capacitor C2. On the output side, the power supply 8 is connected to the terminals of a trigger device 6. As compared to the embodiment of the accessory device 10 according to FIG. 5, this embodiment eliminates the rectifier 28, since rectifiers are already included in the voltage link converter.

Figure 7:
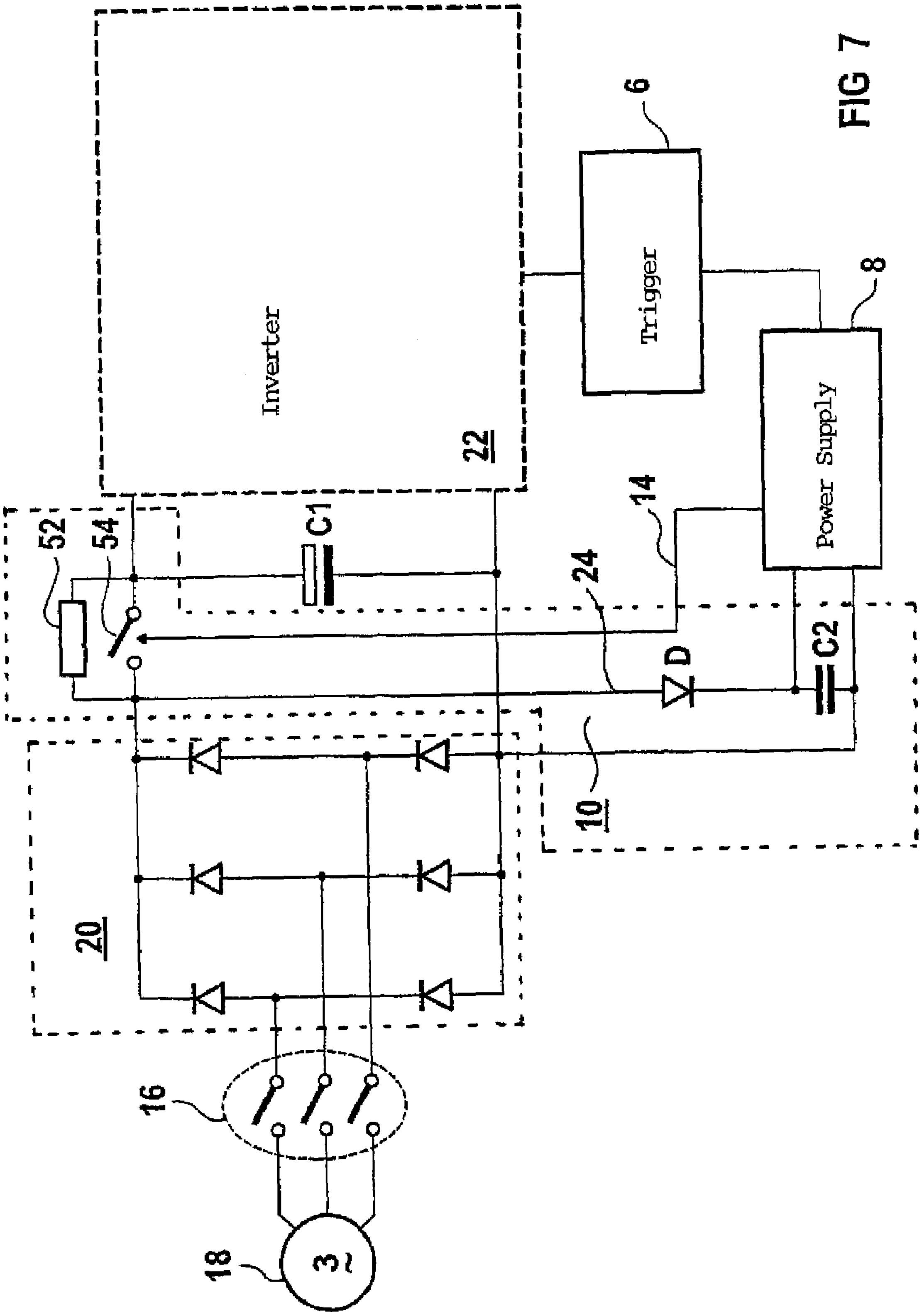

The voltage link converter of FIG. 7 includes a precharging resistor 52 which can be bypassed by a switch 54. This bypassable precharging resistor 52 is arranged in the positive current bus between the network-side converter 20 and the inverter 22. In this embodiment of the voltage link converter, the accessory device 10 has also a series connection 24 which includes a decoupling diode D and an auxiliary capacitor C2. The series connection 24 is connected electrically parallel to the output of the network-side converter 20. The power supply 8 of the trigger device 6 of the self-conducting power semiconductors 4 of the inverter 22 is, on the input side, connected electrically parallel to the auxiliary capacitor C2. In addition, the power supply 8 is connected to a control input of the switch 54 via a control line 14. The switch 54 is activated as soon as the voltage of the link capacitor C1 exceeds a predetermined value.

Figure 8:
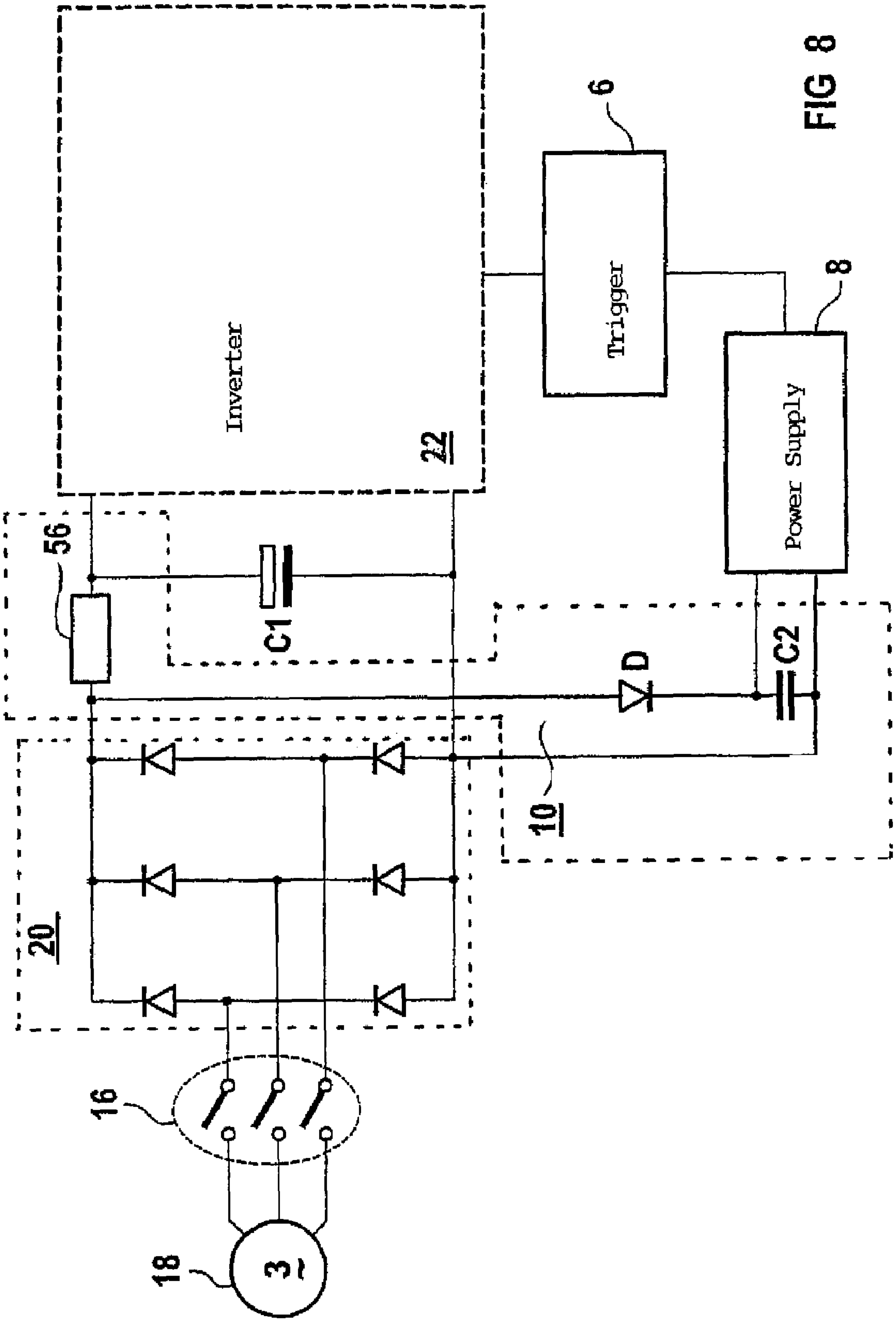

An NTC resistor 56 (FIG. 8) can be employed instead of the bypassable precharging resistor 52. When the network 18 is connected to the uncharged voltage link capacitor C1 and the NTC resistor 56 is cold, the NTC resistor 56 dissipates voltage and limits the current flowing through the inverter 22 which is still short-circuited. Since the voltage for the power supply 8 is tapped before the NTC resistor 56, as seen in the current flow direction, the tapped voltage can start supplying power to block the self-conducting power semiconductors 4 of the inverter 22. As soon as a self-conducting power semiconductors 4 are blocking, the voltage link capacitor C1 is charged. It is important in this embodiment, that the power supply 8 of the trigger device 6 becomes quickly operational, before the short-circuit current causes the NTC resistor 56 to heat up and transitions into a low impedance state. As compared to the embodiment of FIG. 7, a switch 54 and a control line 14 are eliminated.

Figure 9:
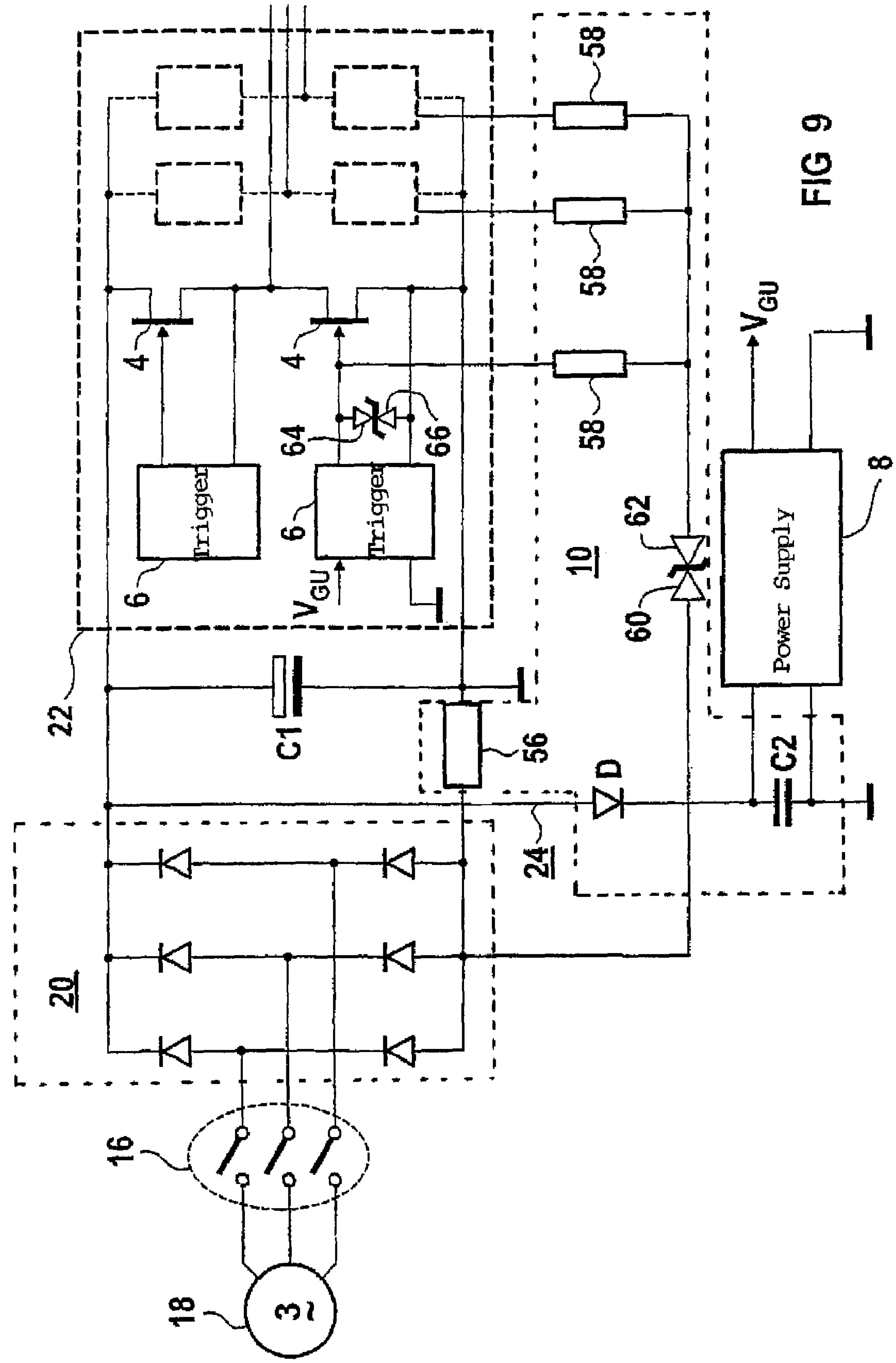

FIG. 9 illustrates an embodiment wherein the short-circuit of the voltage link capacitor C1 is immediately removed when the network 18 is switched in. This is achieved by placing the NTC resistor 56 in the reference bus (ground bus) of the voltage link converter between the network-side converter 20 and the inverter 22. In addition to the series connection 24, the accessory device 10 has a corresponding resistor 58 for each of the self-conducting power semiconductors 4 of the lower bridge side of the inverter 22. One terminal of the self-conducting power semiconductors 4 is electrically connected to the reference bus. Each resistor 58 is connected, on one hand, with a control terminal of a self-conducting power semiconductor 4 and, on the other hand, via two antiparallel connected Zener diodes 60 and 62 with the reference bus in the network-side converter 20. The voltage present at the NTC resistor 56 minus the Zener voltages of the Zener diodes 60, 62 is applied by these resistors 58 to the control inputs of the self-conducting power semiconductors 4 of the lower bridge side of the inverter 22 as a negative blocking voltage. Since this voltage can be greater than tolerable for the control terminals of the self-conducting power semiconductors 4, each control terminal is protected by a Zener diode 64 and 66. The resistors 58 all have a high impedance in order to keep the power dissipation of the Zener diodes 60 to 64 as low as possible. During continuous operation, the voltage at the resistors 58 is less than iSV. The Zener diodes 60 and 62 prevent the voltage drop at the NTC resistor 56 during normal operation to affect the trigger operation of the self-conducting power semiconductors 4 of the inverter 22. The input of the power supply 8 is connected electrically parallel to the auxiliary capacitor C2. On the output side, the power supply 8 is connected to the terminals of the trigger device 6, supplying a trigger voltage $V_{GU}$.

Figure 10:
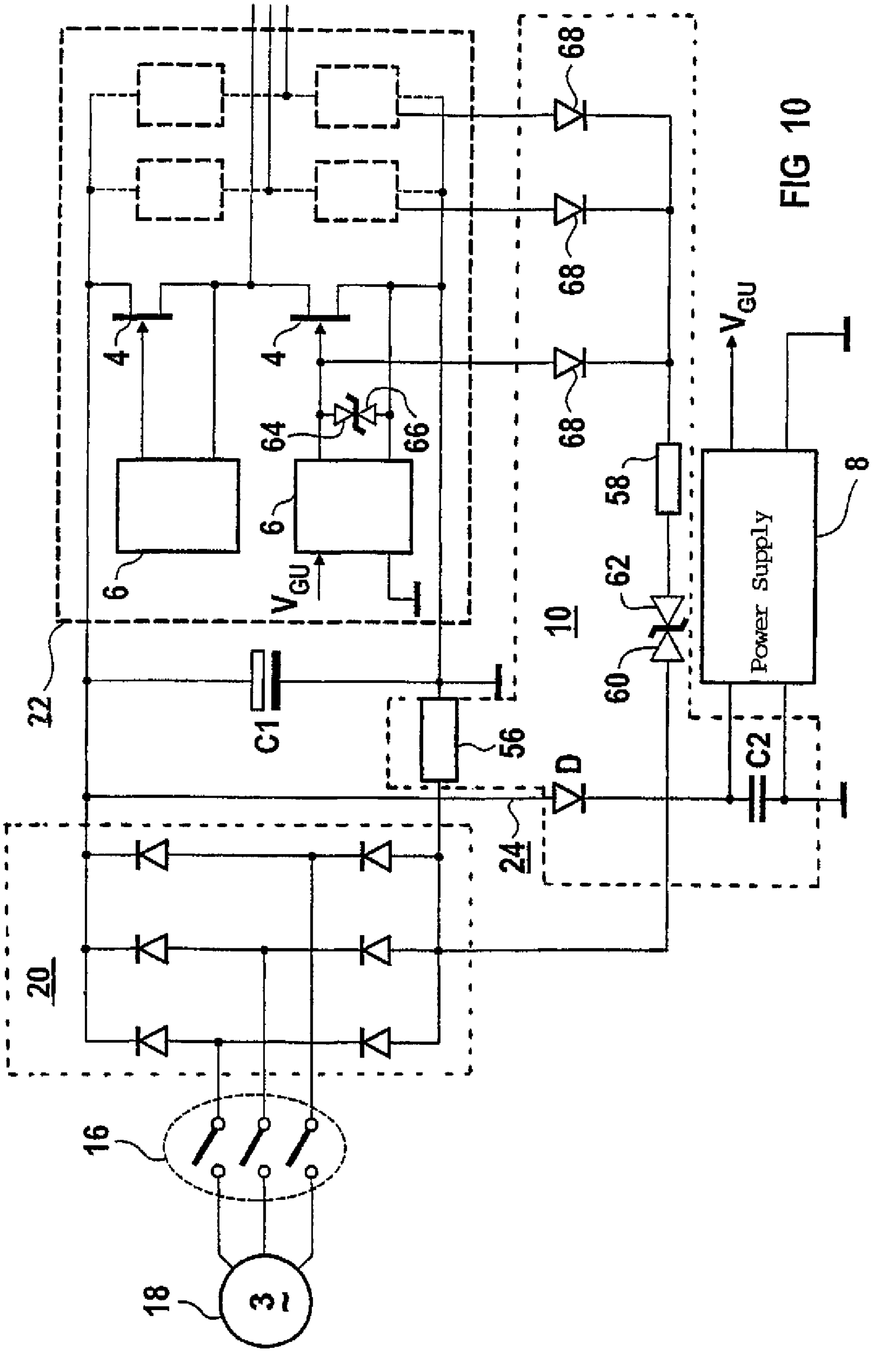

FIG. 10 depicts in greater detail an advantageous embodiment of the accessory device 10 according to FIG. 9. This variant of the accessory device 10 requires only a single resistor 58. However, three diodes 68 are provided which are connected so that the diodes 68 all block during normal operation and no current flows through the resistor 58. The diodes 68 are low voltage diodes.

Figure 11:
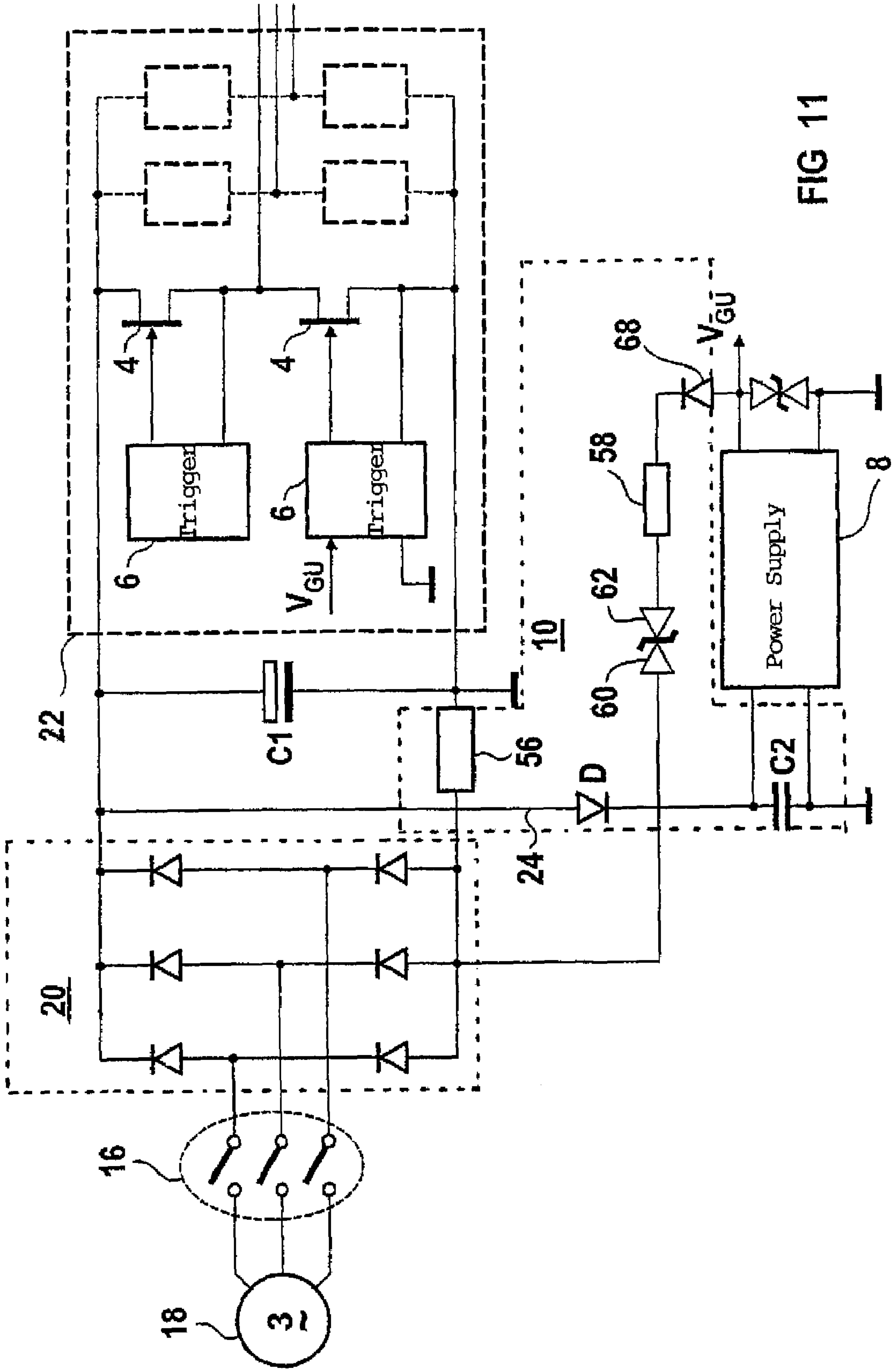

FIG. 11 shows in more detail another advantageous embodiment of the accessory device 10. In this modification of the accessory device 10, only a single resistor 58 and a single diode 68 are required. Unlike in the embodiment of FIG. 10, the diode 68 is not connected to a control terminal of a self-conducting power semiconductor 4, but rather to the output of the power supply 8. In this way, the supply voltage of the trigger devices 6 of the self-conducting power semiconductors 4 of the lower bridge side of the inverter 22 is directly generated by the voltage drop at the NTC resistor 56.

Figure 12:
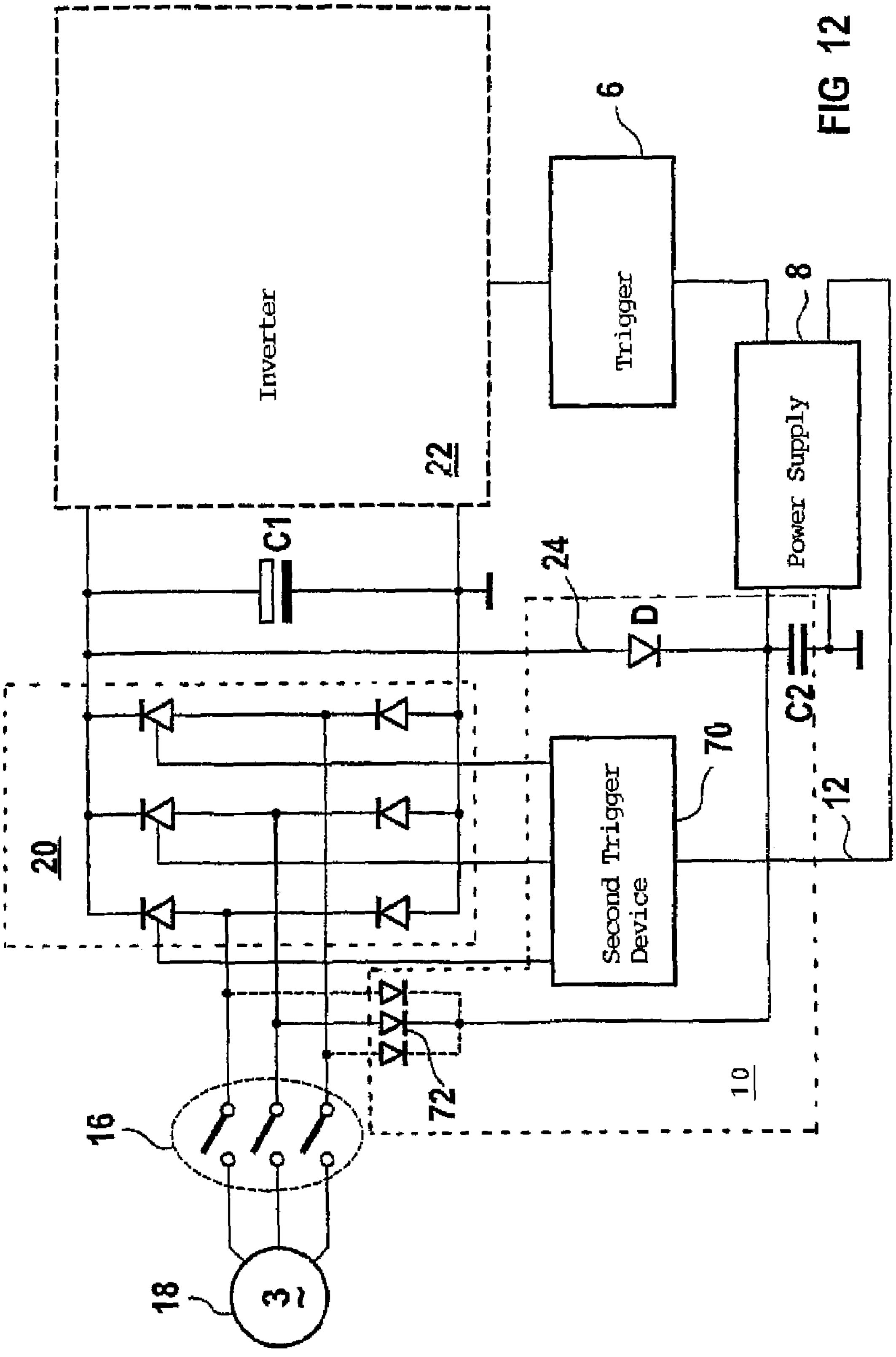

FIG. 12 depicts a voltage link converter which has as a network-side converter 20 a half-controlled thyristor bridge. The negative current bus between the network-side converter 20 and the inverter 22 of this voltage link converter is connected to ground. A second trigger device 70, which is connected to an output of the power supply 8 via a line 12, is provided for triggering the thyristors of the half-controlled bridge. The accessory device 10 has, like in FIG. 4, a series connection 24 which is connected electrically parallel to the output of the network-side converter 20. Unlike the embodiment of FIG. 4, the connection point of the diode D and the auxiliary capacitor C2 is connected to a diode 72 with a network line. When the converter is connected to the network 18 by the ON/OFF switch 16, the voltage link circuit has initially a zero voltage, since the thyristors of the half-controlled bridge have not yet received trigger pulses.

The power supply 8 is connected on the input side to a network line via at least one diode 72, so that the power supply 8 can generate a supply voltage for the trigger device 6 of the self conducting power semiconductors 4 of the inverter 22 and for the trigger device 70 of the thyristors. Alternatively, three diodes may be provided. As soon as a supply voltage is generated, the self-conducting power semiconductors 4 of the inverter 22 are blocked and the thyristors are triggered. The link circuit of the converter is started up by decreasing the firing angle slowly to zero, starting from the end positions of the inverter. After the link circuit is started, the power supply 8 receives its energy from the voltage link capacitor C1.

Figure 13:
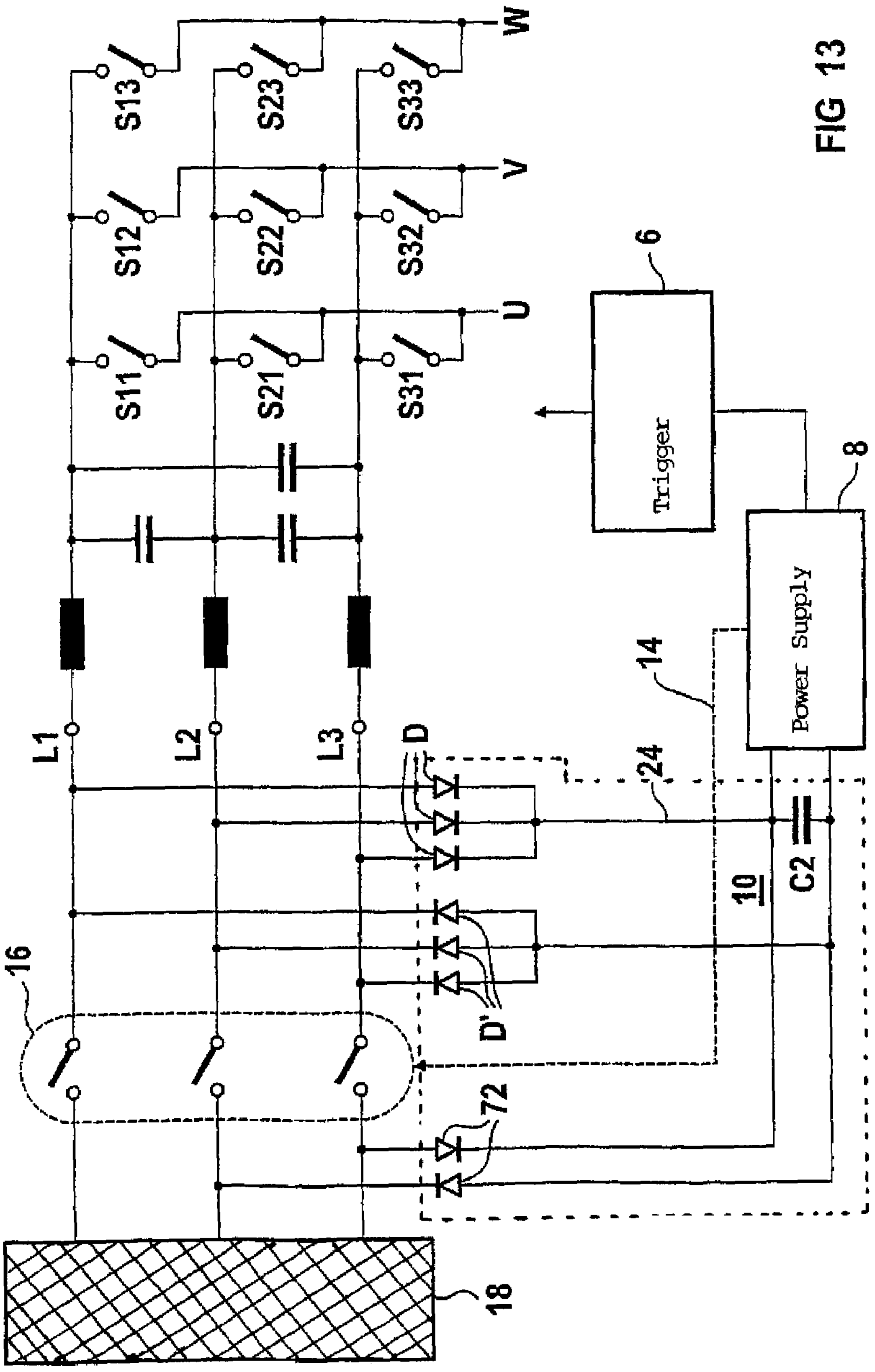

The electronic power circuit can also be implemented as a matrix converter, shown in FIG. 13, whose self-blocking power semiconductors can be replaced by self-conducting power semiconductors. The electronic power circuit of a matrix converter also includes a series connection 24 in the accessory device 10. This particular series connection includes three diodes D instead of a single diode D. Moreover, the second terminal of the auxiliary capacitor C2 is connected to the input terminals of the matrix converter via three diodes D'. The power supply 8 of the trigger device 6 of the self-conducting power semiconductors 4 of the matrix converter receives power from the network 18, before the matrix converter is connected to the network 18 via the switch 16. For this purpose, the power supply 8 is, on the input side, connected to two network lines via two diodes 12. As soon as the self-conducting power semiconductors 4 are blocked, the ON/OFF switch 16 is closed via the control line 14.

Since it is extremely important to correctly supply trigger energy to the self-conducting power semiconductor(s) of an electronic power circuit 2 for their operation, the power supply 8 can be implemented redundantly.

Figure 14:
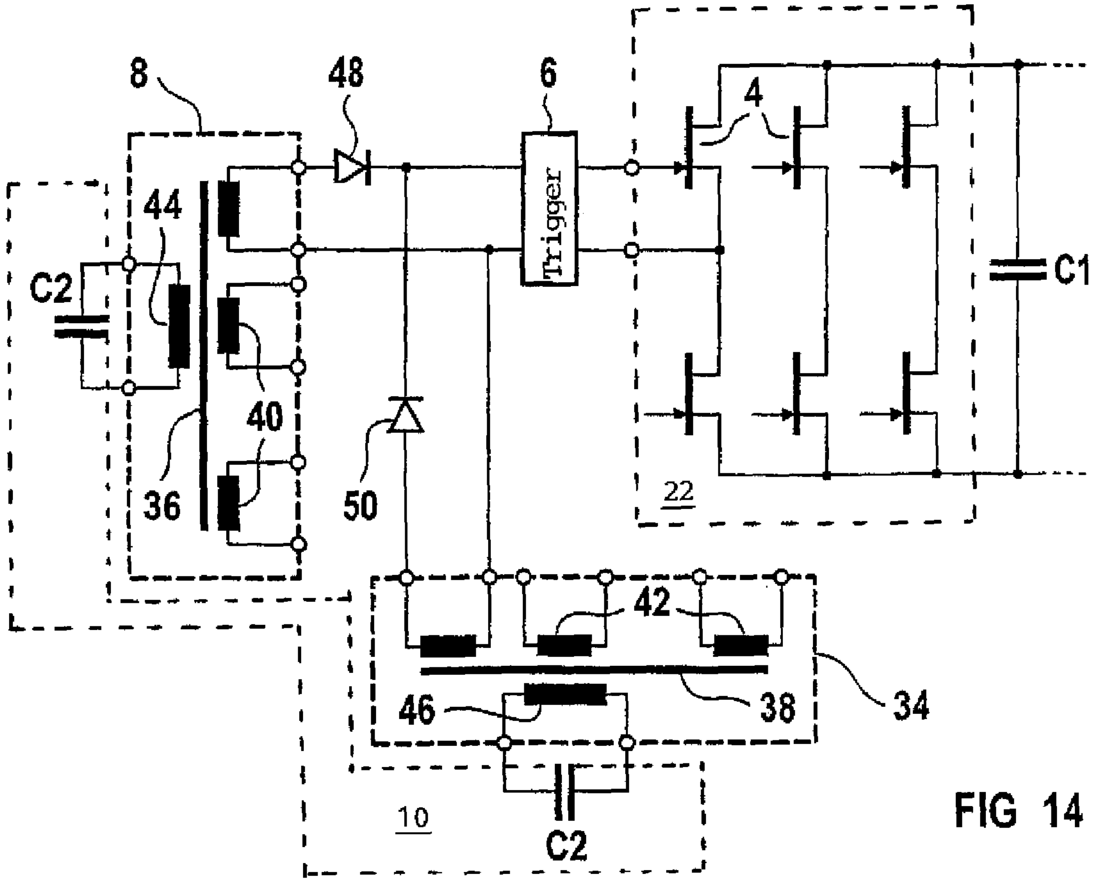
FIGS. 14 and 15 show each still further embodiments of an electronic power circuit according to the invention.

FIG. 14 illustrates a redundant embodiment of the power supply 8. In this diagram, each of the power supplies 8 and 34 is implemented as a switched mode power supply. For sake of clarity, only the input transformer 36 and 38, respectively, is shown. Since each power supply 8 and 34 powers six trigger devices 6 of the six self-conducting power semiconductors 4 of an inverter 22 of a voltage link converter, the transformers 36 and 38 have each six secondary windings 40 and 42. The respective primary winding 44 and 46 of the power supply 8 and 34, respectively, is connected electrically parallel to the auxiliary capacitor C2. One output of the corresponding secondary windings 40 and 42 is provided with a corresponding decoupling diode 48 or 50. The outputs of each secondary winding 40, 42 are connected to a corresponding trigger device 6 of a self-conducting power semiconductor 4. This redundant layout of the power supply 8 ensures that the self-conducting power semiconductors switches 4 of the electronic power circuit 2 are always provided with trigger energy for their operation.

Figure 15:
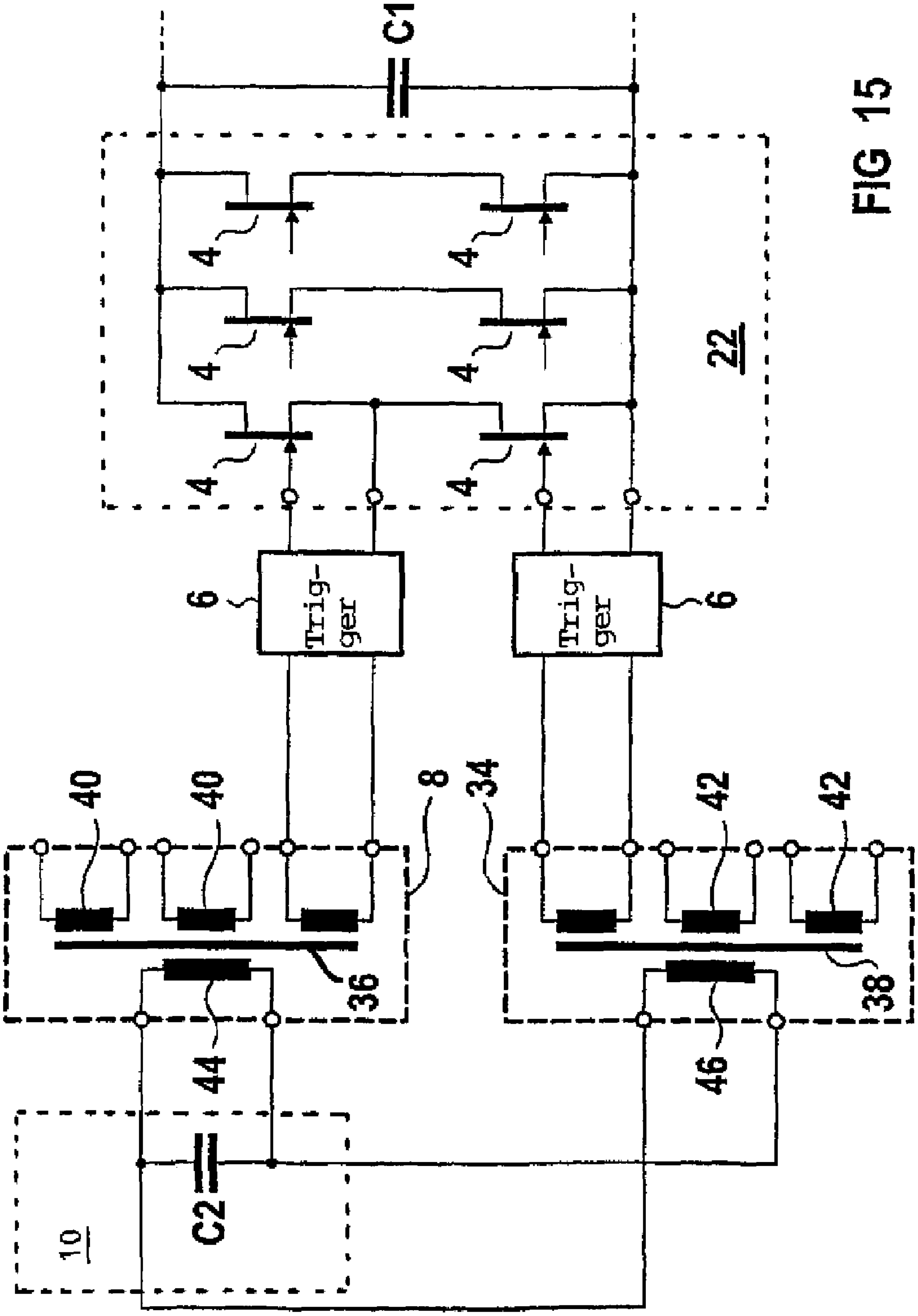

FIG. 15 shows another embodiment of a circuit with two power supplies 8 and 34. In this diagram, the two power supplies 8 and 34 are not connected electrically in parallel, but are each associated with a prearranged trigger device 6. The outputs of the power supply 8 are connected to the trigger devices 6 of the self-conducting power semiconductor 4 of an upper bridge side of the inverter 22 of a voltage link converter, whereas the outputs of the current supply 34 are connected to the trigger devices 6 of the self-conducting power semiconductors 4 of the lower bridge side of the inverter 22. Since each power supply 8, 34 has to supply only three trigger devices 6, each of the corresponding input transformers 36, 38 has only three secondary windings 40 and 42. This configuration prevents an unintentional short-circuit in the link circuit of a voltage link converter. However, if one power supply 8 or 34 fails, the electronic power circuit 2 must be switched off.

When an accessory device 10 is employed, self-blocking power semiconductors in conventional converter circuits can be directly replaced with a self-conducting power semiconductor 4, which is more cost-effective and reduces forward losses. Moreover, the free-wheeling diode can also be eliminated when using self-conducting power semiconductors 4 in conventional converter circuits, which further reduces circuit complexity and space requirements.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and their equivalents:

What is claimed is:

1. An electronic power circuit having an ON/OFF switch connected to a power mains, said electronic power circuit comprising:

at least one power semiconductor implemented as a self-conducting power semiconductor;

a trigger device having an output connected to control inputs of the at least one power semiconductor;

a power supply having an output side, which is operatively connected to the trigger device, and having an input side; and an accessory device connected to receive a first supply voltage from the power mains, said accessory device cooperating with said power supply to provide a predetermined second supply voltage to said trigger device of said self-conducting power semiconductor, so that said self-conducting power semiconductor is blocked when power is applied to said self-conducting power semiconductor after the ON/OFF switch is closed.

2. The electronic power circuit of claim 1, wherein the self-conducting power semiconductor is made of silicon carbide.

3. The electronic power circuit of claim 1, wherein the self-conducting power semiconductor is a Junction-Field-Effect-Transistor (JFET) with a high reverse blocking voltage.

4. The electronic power circuit of claim 1, wherein the self-conducting power semiconductor is constructed to have a saturating characteristic which limits a current flow independent of an applied voltage.

5. The electronic power circuit of claim 1, wherein the power supply is a DC/DC converter.

6. The electronic power circuit of claim 1, further comprising a free-wheeling converter having an input side connected to an electric power grid, and having a voltage link capacitor, wherein the accessory device includes an auxiliary capacitor and a decoupling diode electrically connected in series, the series connection of the auxiliary capacitor and decoupling diode being connected in parallel to the output of the converter, wherein the input side of the power supply is electrically connected in parallel to the auxiliary capacitor.

7. The electronic power circuit of claim 1, wherein the accessory device includes a rectifier, a switch for connecting an AC-side of the rectifier to a supply voltage of a power grid, and an auxiliary capacitor connected across a DC-side of the rectifier and connected to the input side of the power supply.

8. The electronic power circuit of claim 1, further comprising a free-wheeling converter having an input side connected to an electric power grid, and having a voltage link capacitor, wherein the accessory device includes an auxiliary capacitor electrically connected across a DC-output side of the converter, and a switch arranged in a connection between the voltage link capacitor and the auxiliary capacitor, with the input side of the power supply connected with the DC-output side of the converter.

9. The electronic power circuit of claim 1, further comprising a free-wheeling converter having an input side connected to an electric power grid, a voltage link capacitor, and a precharging resistor arranged in a positive line between an output of the converter and the voltage link capacitor and having a switch bridging the precharging resistor, wherein the accessory device includes an auxiliary capacitor and a decoupling diode electrically connected in series, with the series connection connected in parallel to the output of the converter, wherein the input side of the power supply is electrically connected in parallel to the auxiliary capacitor and linked via a control line to the switch that bridges the precharging resistor.

10. The electronic power circuit of claim 1, further comprising a free-wheeling converter having an input side connected to an electric power grid, a voltage link capacitor, and an NTC resistor arranged in a positive line between an output of the converter and the voltage link capacitor, wherein the accessory device includes an auxiliary capacitor and a decoupling diode electrically connected in series, with the series connection connected in parallel to the output of the converter, wherein the input side of the power supply is electrically connected in parallel to the auxiliary capacitor.

11. The electronic power circuit of claim 1, and further comprising a free-wheeling converter having an input side connected to an electric power grid, a voltage link capacitor, and an NTC resistor connected in a ground connection between an output side of the converter and the voltage link capacitor, wherein the accessory device includes a decoupling diode and an auxiliary capacitor connected in series, with the series connection connected in parallel to the output side of the converter and the auxiliary capacitor connected in parallel to the input side of the power supply, two anti-parallel connected Zener diodes, and at least one resistor, said resistor connected with a control terminal of the self-conducting power semiconductor, on one hand, and via the Zener diodes to a ground terminal of the converter, on the other hand.

12. The electronic power circuit of claim 10, and further comprising another decoupling diode connected between the resistor and the control terminal of the self-conducting power semiconductor.

13. The electronic power circuit of claim 1, and further comprising a free-wheeling converter having an input side connected to an electric power grid, a voltage link capacitor, and an NTC resistor connected in a ground connection between an output side of the converter and the voltage link capacitor, wherein the accessory device includes a decoupling diode and an auxiliary capacitor connected in series, with the series connection connected in parallel to the output side of the converter and the auxiliary capacitor connected in parallel to the input side of the power supply, two anti-parallel connected Zener diodes, a resistor and another decoupling diode connected in series between a ground terminal of the converter and a positive output of the power supply.

14. The electronic power circuit of claim 1, and further comprising a half-controlled converter connected to an electric power grid, a second trigger device connected to an output of the power supply and controlling the half-controlled converter, a voltage link capacitor, and at least one diode, wherein the accessory device includes an auxiliary capacitor and a decoupling diode which are electrically connected in series, with the series connection connected in parallel with an output of the converter, with the input side of the power supply connected in parallel to the auxiliary capacitor, wherein a connection point of the decoupling diode and the auxiliary capacitor is decoupled from a power supply line by the at least one diode.

15. The electronic power circuit of claim 1, wherein the electronic power circuit is a matrix converter.

16. The electronic power circuit of claim 7, wherein the switch in the accessory device is implemented as an electronic switch.

17. The electronic power circuit of claim 8, wherein the switch in the accessory device is implemented as an electronic switch.

18. The electronic power circuit of claim 1, wherein said power supply is a switched mode power supply.

19. The electronic power circuit of claim 7, wherein the auxiliary capacitor has a capacitance value which is significantly smaller than a capacitance value of the voltage link capacitor.

20. The electronic power circuit of claim 8, wherein the auxiliary capacitor has a capacitance value which is significantly smaller than a capacitance value of the voltage link capacitor.

21. The electronic power circuit of claim 9, wherein the auxiliary capacitor has a capacitance value which is significantly smaller than a capacitance value of the voltage link capacitor.

22. The electronic power circuit of claim 9, wherein the auxiliary capacitor has a capacitance value which is significantly smaller than a capacitance value of the voltage link capacitor.

23. The electronic power circuit of claim 11, wherein the auxiliary capacitor has a capacitance value which is significantly smaller than a capacitance value of the voltage link capacitor.

24. The electronic power circuit of claim 12, wherein the auxiliary capacitor has a capacitance value which is significantly smaller than a capacitance value of the voltage link capacitor.

25. The electronic power circuit of claim 13, wherein the auxiliary capacitor has a capacitance value which is significantly smaller than a capacitance value of the voltage link capacitor.

26. The electronic power circuit of claim 1, wherein the electronic power circuit is an inverter.

27. The electronic power circuit of claim 1, wherein the electronic power circuit is a self-commutated network converter.

28. The electronic power circuit of claim 1, further comprising a redundant power supply and a redundant accessory device, said redundant accessory device cooperating with said redundant power supply and with said accessory device and said power supply to provide said predetermined second supply voltage to said trigger device.

29. The electronic power circuit of claim 1, further comprising a redundant power supply and a redundant accessory device, said redundant accessory device cooperating with said redundant power supply and with said accessory device and said power supply to provide a predetermined second supply voltage to said trigger device of said self-conducting power semiconductor immediately after the ON/OFF is closed, so that said self-conducting power semiconductor is blocked.

* * * * *